(12) United States Patent
Hyodo

(10) Patent No.: US 6,913,795 B2
(45) Date of Patent: Jul. 5, 2005

(54) METHOD OF MAKING TETRAHEDRAL AMORPHOUS CARBON FILM INCLUDING FLUORINE ATOMS

(75) Inventor: Hiroyuki Hyodo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 148 days.

(21) Appl. No.: 10/281,648

(22) Filed: Oct. 28, 2002

(65) Prior Publication Data

US 2003/0148102 A1 Aug. 7, 2003

(30) Foreign Application Priority Data

Feb. 4, 2002 (JP) .......................................... 2002-026401

(51) Int. Cl.$^7$ .............................................. C23C 14/06
(52) U.S. Cl. ...................... 427/530; 427/561; 427/577; 427/249.7
(58) Field of Search .................................. 427/523, 525, 427/530, 561, 577, 249.7, 249.1, 580

(56) References Cited

U.S. PATENT DOCUMENTS

| | | | |
|---|---|---|---|
| 5,612,134 A | | 3/1997 | Okita et al. |
| 5,846,613 A | * | 12/1998 | Neuville ...................... 427/575 |
| 5,858,477 A | * | 1/1999 | Veerasamy et al. .......... 427/562 |
| 5,942,328 A | * | 8/1999 | Grill et al. ................... 428/408 |
| 6,147,407 A | * | 11/2000 | Jin et al. ...................... 257/758 |
| 6,236,543 B1 | | 5/2001 | Han et al. |
| 6,447,891 B1 | * | 9/2002 | Veerasamy et al. .......... 428/216 |
| 6,475,573 B1 | * | 11/2002 | Veerasamy et al. .......... 427/523 |
| 6,504,294 B1 | * | 1/2003 | Mahoney et al. ........... 313/359.1 |
| 6,638,570 B2 | * | 10/2003 | Veerasamy ................ 427/249.7 |

FOREIGN PATENT DOCUMENTS

| | | |
|---|---|---|
| JP | 8-147655 | 6/1996 |
| JP | 2000-222714 | 8/2000 |

OTHER PUBLICATIONS

Weiler, M., "Highly tetrahedral, diamond–like amorphous hydrogenated carbon prepared from a plasma beam source." Appl. Phys. Lett. 64(21) May 1994, pp. 2797–2799.*

* cited by examiner

Primary Examiner—Bret Chen
(74) Attorney, Agent, or Firm—Greer, Burns & Crain, Ltd.

(57) ABSTRACT

A method of making a tetrahedral amorphous carbon (ta-C) film comprises depositing carbon atoms over the surface of an object. The surface of the object is kept exposed to fluorine atoms during the deposition of the carbon atoms. The method allows the fluorine atoms to scatter within the deposited carbon atoms in the tetrahedral amorphous carbon film. The hardness of the tetrahedral amorphous carbon film can be improved in response to an increased content of $sp^3$ carbon bonds included within the tetrahedral amorphous carbon film. In addition, the tetrahedral amorphous carbon film still provides a sufficient repellent performance to water due to the fluorine atoms existing near the exposed surface of the tetrahedral amorphous carbon film.

6 Claims, 4 Drawing Sheets

METHOD OF MAKING TETRAHEDRAL AMORPHOUS CARBON FILM INCLUDING FLUORINE ATOMS

BACKGROUND OF THE INVENTION

1. Field of the Invention

The present invention relates to a hard carbon film overlaid on an object. In particular, the invention relates to a hard carbon protection film overlaid on the bottom surface of a slider body in a head slider. The head slider may be incorporated within a magnetic recording medium drive such as a hard disk drive, for example.

2. Description of the Prior Art

In general, ahead slider includes a hard carbon film formed to extend over the bottom surface of a slider body. Electronic cyclotron resonance chemical vapor deposition (ECR-CVD) or ion beam deposition (IBD) is usually utilized to form the hard carbon film. The hard carbon film covers over a head or transducer element exposed from the slider body. The hard carbon film serves to protect the head element from damages even when the head slider collides against a hard disk, representative of a magnetic recording medium, and/or contaminations scattered over the head disk.

Fluorine is applied to the surface of the hard carbon film. The surface of the hard carbon film is exposed to $CF_4$ plasma for the application of the fluorine. The fluorine serves to prevent adherence or attachment of water or a lubricant agent to the surface of the hard carbon film. Corrosion of the head element can thus be prevented. In addition, if adherence or attachment of water or a lubricant agent is reliably prevented in this manner, the head slider is allowed to keep flying above the surface of the magnetic recording medium or hard disk by a stable flying height.

As conventionally known, an increased quantity of $sp^3$ carbon bonds leads to establishment of the compact structure in the hard carbon film. An increased hardness of the hard carbon film gets improved. However, the hardness of the hard carbon film tends to hinder attachment or adherence of the fluorine to the surface of the hard carbon film. Insufficient application of the fluorine may lead to an inevitable attachment or adherence of water or lubricant agent to the head slider.

SUMMARY OF THE INVENTION

It is accordingly an object of the present invention to provide a hard carbon film capable of reliably prevent attachment or adherence of water or lubricant agents irrespective of improvement in the hardness.

According to the present invention, there is provided a method of making a tetrahedral amorphous carbon (ta-C) film, comprising: depositing carbon atoms over the surface of an object, keeping the surface of the object exposed to fluorine atoms.

The method allows the fluorine atoms to scatter within the deposited carbon atoms in the tetrahedral amorphous carbon film. The hardness of the tetrahedral amorphous carbon film can be improved in response to an increased content of $sp^3$ carbon bonds included within the tetrahedral amorphous carbon film. In addition, the tetrahedral amorphous carbon film still provides a sufficient repellent performance to water due to the fluorine atoms existing near the exposed surface of the tetrahedral amorphous carbon film. In particular, since the fluorine atoms are applied during the deposition of the carbon atoms, the fluorine atoms of a sufficient quantity can be introduced into the tetrahedral amorphous carbon film having a compact or closely-packed structure based on an increased amount of $sp^3$ carbon bonds.

When the object is to be exposed to the fluorine atoms in the aforementioned manner, the object may be located within the atmosphere of a compound gas including fluorine. Alternatively, the object may be subjected to irradiation of a fluoric ion beam. In either case, the fluorine atoms can sufficiently be introduced into the tetrahedral amorphous carbon film during the deposition of the carbon atoms.

When the carbon atoms are to be deposited over the surface of the object, the object may be subjected to irradiation of a carbonic ion beam. In particular, it is preferable to utilize a filtered cathodic arc (FCA) to generate the carbonic ion beam. The FCA serves to increase the $sp^3$ carbon bonds within the tetrahedral amorphous carbon film in a relatively facilitated manner. The tetrahedral amorphous carbon film can efficiently be obtained over the surface of the object.

The above-described method provides a tetrahedral amorphous carbon film overlaid on a substrate and including fluorine atoms inside the film. The obtained tetrahedral amorphous carbon film is allowed to enjoy a sufficient hardness and repellent performance to water at the exposed surface.

In this case, the fluorine atoms preferably disperse within tetrahedral amorphous carbon. The content of $sp^3$ carbon bonds is preferably set equal to or larger than 80%. This content of the $sp^3$ carbon bonds leads to a sufficient hardness of the tetrahedral amorphous carbon film. The content of the fluorine atoms is preferably set smaller than 20 at %. If the content of fluorine atoms is set at 20 at % or larger, a sufficient hardness cannot be obtained in the tetrahedral amorphous carbon film.

The tetrahedral amorphous carbon film of the invention may be utilized in a head slider incorporated within a magnetic recording disk drive such as a hard disk drive (HDD), for example. The head slider may comprise a slider body opposing the bottom surface to the recording medium; and a tetrahedral amorphous carbon film overlaid on the bottom surface, said film including fluorine atoms inside. The bottom surface of the head slider can be covered with a protection film having an increased hardness. The bottom surface of the slider body can be protected from damages or collisions irrespective of a reduction in the thickness of the tetrahedral amorphous carbon film. Moreover, since the fluorine atoms exist near the exposed surface of the tetrahedral amorphous carbon film over the bottom surface, a sufficient repellent performance to water can be established over the bottom surface. The bottom surface is reliably prevented from attachment or adherence of water and lubricant agents. The head slider can thus be prevented from variation in the weight.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
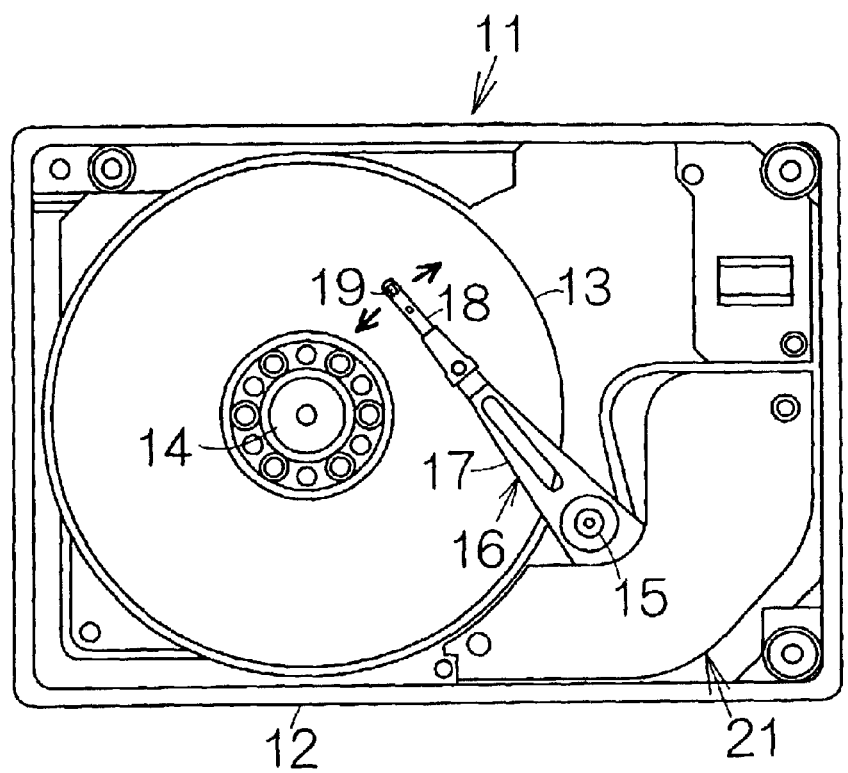
FIG. 1 is a plan view schematically illustrating the interior structure of a hard disk drive (HDD)

FIG. 1 schematically illustrates the interior structure of a hard disk drive (HDD) 11 as an example of a magnetic recording medium drive or storage device. The HDD 11 includes a box-shaped primary enclosure 12 defining an inner space of a flat parallelepiped, for example. At least one recording medium or magnetic recording disk 13 is accommodated in the inner space within the primary enclosure 12. The magnetic recording disk 13 is mounted on a driving shaft of a spindle motor 14. The spindle motor 14 is allowed to drive the magnetic recording disk 13 for rotation at a higher revolution rate such as 7,200 rpm or 10,000 rpm, for example. A cover, not shown, is coupled to the primary enclosure 12 so as to define the closed inner space between the primary enclosure 12 and itself.

A carriage 16 is also accommodated in the inner space of the primary enclosure 12 for swinging movement about a vertical support shaft 15. The carriage 16 includes a rigid swinging arm 17 extending in the horizontal direction from the vertical support shaft 15, and an elastic head suspension 18 fixed to the tip end of the swinging arm 17 so as to extend forward from the swinging arm 17. As conventionally known, a flying head slider 19 is cantilevered at the tip end of the head suspension 18 through a gimbal spring, not shown. The head suspension 18 serves to urge the flying head slider 19 toward the surface of the magnetic recording disk 13. When the magnetic recording disk 13 rotates, the flying head slider 19 is allowed to receive an airflow generated along the rotating magnetic recording disk 13. The airflow serves to generate a lift on the flying head slider 19. The flying head slider 19 is thus allowed to keep flying above the surface of the magnetic recording disk 13 during rotation of the magnetic recording disk 13 at a higher stability established by the balance between the lift and the urging force of the head suspension 18.

When the carriage 16 is driven to swing about the support shaft 15 during flight of the flying head slider 19, the flying head slider 19 is allowed to cross the recording tracks defined on the magnetic recording disk 13 in the radial direction of the magnetic recording disk 13. This radial movement serves to position the flying head slider 19 right above a target recording track on the magnetic recording disk 13. In this case, an electromagnetic actuator 21 such as a voice coil motor (VCM) can be employed to realize the swinging movement of the carriage 16, for example. As conventionally known, in the case where two or more magnetic recording disks 13 are incorporated within the inner space of the primary enclosure 12, a pair of the elastic head suspensions 18 are disposed between the adjacent magnetic recording disks 13.

Figure 2:
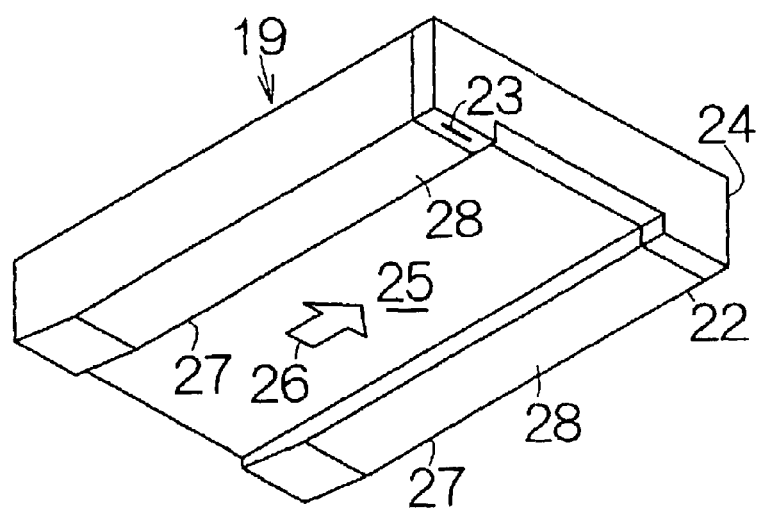
FIG. 2 is an enlarged perspective view schematically illustrating the structure of a flying head slider according to a specific example.

FIG. 2 illustrates a specific example of the flying head slider 19. The flying head slider 19 of this type includes a slider body 22 made of $Al_2O_3$—TiC in the form of a flat parallelepiped, and a head protection layer 24 formed to spread over the trailing or outflow end of the slider body 22. The head protection layer 24 may be made of $Al_2O_3$. A read/write electromagnetic transducer 23 is embedded in the head protection layer 24. The read/write electromagnetic transducer 23 may comprise a read element and a write element. The read element may be represented by a giant magnetoresistive (GMR) element, a tunnel-junction magnetoresistive (TMR) element, or the like. The write head may be represented by a thin film magnetic head utilizing a thin film coil pattern. A medium-opposed surface or bottom surface 25 is defined continuously over the slider body 22 and the head protection layer 24 so as to face the surface of the magnetic recording disk 13 at a distance. The bottom surface 25 is designed to receive an airflow 26 generated along the surface of the rotating magnetic recording disk 13.

A pair of rails 27 are formed to extend over the bottom surface 25 from the leading or inflow end toward the trailing or outflow end. The individual rail 27 is designed to define an air bearing surface (ABS) 28 at its top surface. The airflow 26 generates the aforementioned lift at the respective air bearing surfaces 28. The read/write electromagnetic transducer 23 embedded in the head protection layer 24 is allowed to expose the front end at the air bearing surface 28. The flying head slider 19 may take any shape or form other than the above-described one.

Figure 3:
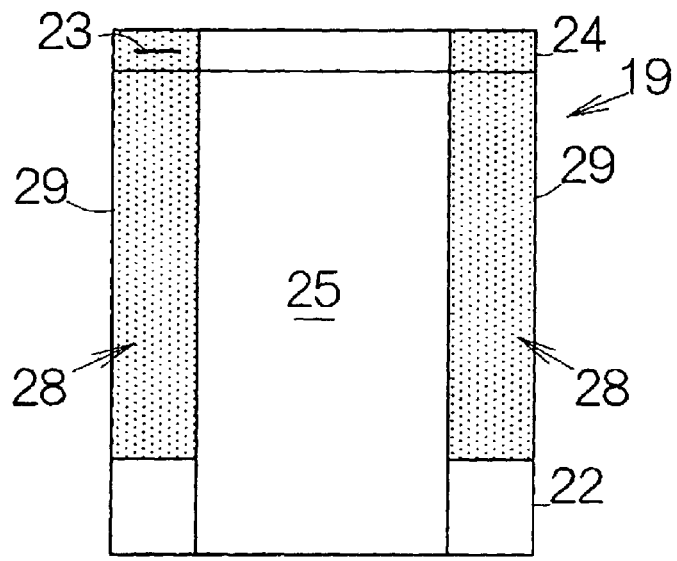
FIG. 3 is a plan view schematically illustrating a medium-opposed or bottom surface of the flying head slider.

As shown in FIG. 3, hard carbon films 29 are overlaid on the overall areas of the air bearing surfaces 28. The exposed front end of the read/write electromagnetic transducer 23 is covered with the hard carbon films 29. The thickness of the hard carbon films 29 may be set equal to or smaller than 5.0 nm, for example.

Figure 4:
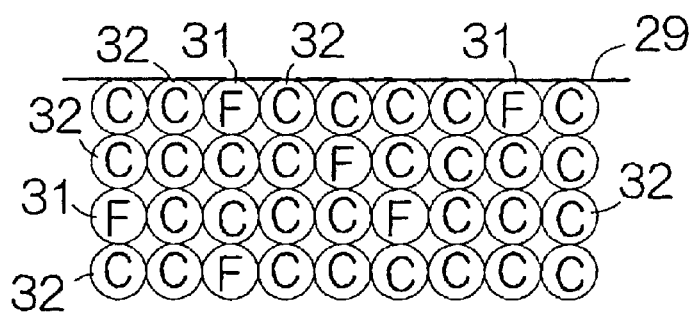
FIG. 4 is an enlarged partial sectional view schematically illustrating the structure of a hard carbon film.

The hard carbon films 29 are made of so-called tetrahedral amorphous carbon (ta-C). Specifically, the content of the $sp^3$ carbon bonds is set equal to or larger than 80% in the hard carbon films 29. In addition, the hard carbon films 29 contain fluorine. As shown in FIG. 4, fluorine atoms 31 are allowed to disperse within the tetrahedral amorphous carbon. The fluorine atoms 31 are completely mixed with carbon atoms 32 of the tetrahedral amorphous carbon. The content of the fluorine may be set smaller than 20 at %.

Since the $sp^3$ carbon bonds of a sufficient quantity are contained in the hard carbon films 29, a compact or closely-packed structure can be established in the hard carbon films 29. The hardness of the hard carbon films 29 can thus be improved. A sufficient hardness can be maintained in the hard carbon films 29 irrespective of a reduction in the thickness of the hard carbon film 29. A reduced thickness of the hard carbon films 29 leads to reduction in the space or distance between the exposed front end of the read/write electromagnetic transducer 23 and the magnetic recording disk 13.

The hard carbon films 29 still provide a sufficient repellent performance due to the fluorine atoms 31 existing near the exposed surfaces of the hard carbon films 29. The air bearing surfaces 28 are reliably prevented from attachment or adherence of water. Corrosion of the read/write electromagnetic transducer 23 is reliably prevented. Likewise, the hard carbon films 29 serve to prevent attachment or adherence of lubricant agents to the air bearing surfaces 28. The flying head slider 19 is allowed to keep flying above the surface of the magnetic recording disk 13 by a stable flying height. The lubricant agents adhering to the flying head slider 19 may bring a change in the weight of the flying head slider 19, so that the flying head slider 19 tends to suffer from variation in the flying height.

Figure 5:
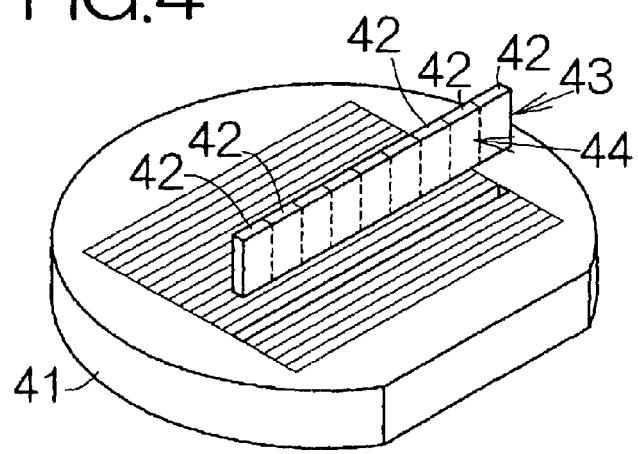
FIG. 5 is a perspective view of a wafer for schematically illustrating the process of making the flying head slider.

Next, a brief description will be made on a method of making the flying head slider 19. As shown in FIG. 5, a wafer 41 made of $Al_2O_3$—TiC is first prepared. The read/write electromagnetic transducers 23 are formed in rows on the surface of the wafer 41. Each of blocks 42 corresponding to the individual flying head sliders 19 receives each of the read/write electromagnetic transducers 23. 100 columns by 100 rows of the flying head sliders 19 may be designed in the sole wafer 41 of 5 inches diameter, for example. The read/write electromagnetic transducers 23 may be established on an $Al_2O_3$ (alumina) film or underlayer overlaid on the surface of the wafer 41. The established read/write electromagnetic transducer is then covered with an alumina film or overlayer. The read/write electromagnetic transducers 23 embedded within the head protection layer 24 can be obtained in this manner on the wafer 41.

Wafer bars 43 are then cut out from the wafer 41. The individual wafer bar 43 includes a row of the blocks 42. The hard carbon film 29 is formed all over the surface of a section 44 of the wafer bar 43. The method of making the hard carbon film 29 will be described later in detail.

After the hard carbon film 29 has been formed, the bottom surfaces 25 are individually scraped on the section 44 of the wafer bar 43 for the corresponding blocks 42. Photolithography may be employed to from the rails 27, for example. The top surfaces of the rails 27, namely, the individual air bearing surfaces 28 are kept covered with photoresist films, so that the hard carbon films 29 remain on the individual air bearing surfaces 28. The individual flying head sliders 19 are finally cut out from the wafer bar 43 for the corresponding blocks 42.

Figure 6:
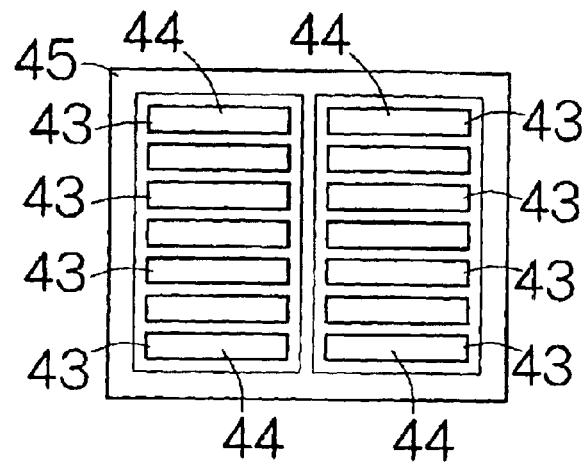
FIG. 6 is a plan view illustrating wafer bars arranged on a jig.
Figure 7:
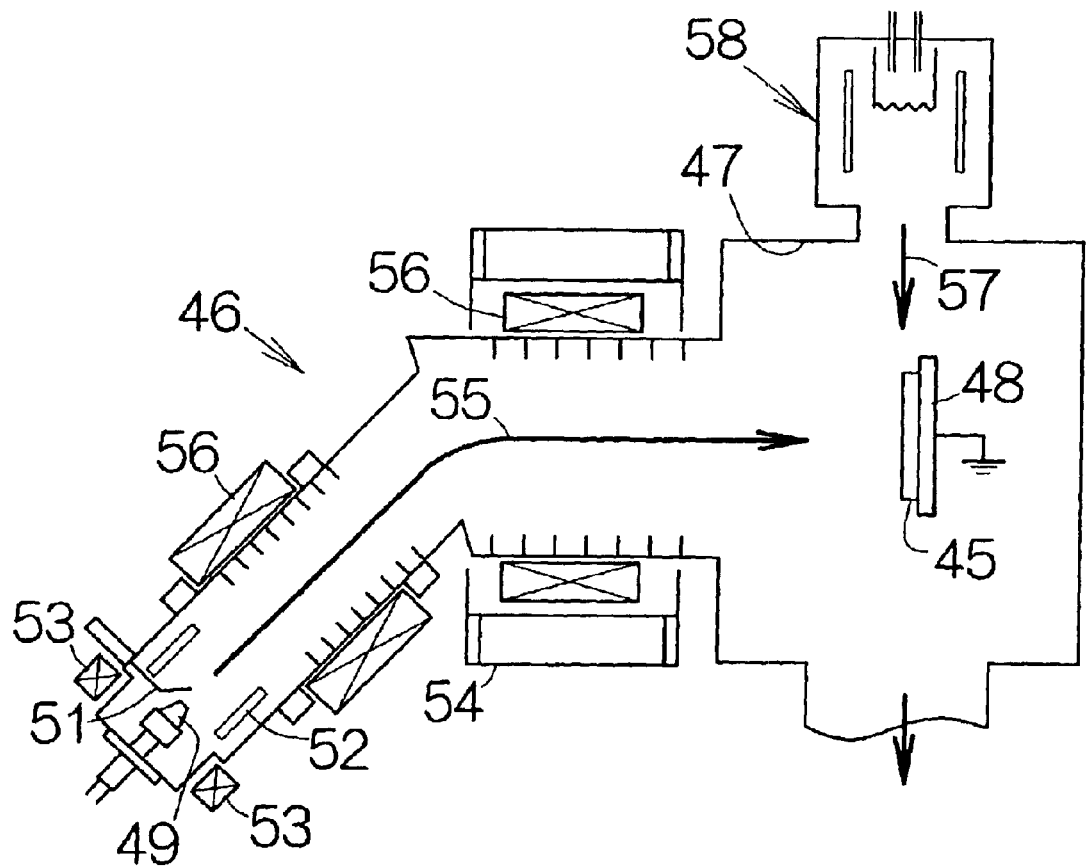
FIG. 7 is a schematic view illustrating the structure of a filtered cathodic arc (FCA) apparatus.

A filtered cathodic arc (FCA) is utilized to form the hard carbon film 29. As shown in FIG. 6, the wafer bars 43 are fixed on a predetermined jig or support 45, for example. An adhesive may be employed to fix the wafer bars 43. The jig 45 is then set in a FCA apparatus 46, as shown in FIG. 7.

Here, a brief description will be made on the structure of the FCA apparatus 46. The FCA apparatus 46 includes a chamber 47. A support plate 48 is located within the chamber 47 for receiving the jig 45. The support plate 48 is allowed to take any attitude based on the rotation around triaxial directions.

A cathode 49 is located within the chamber 47 for holding a target. The target may comprise a block of carbon, for example. A striker 51 serves to generate an arc discharge between the cathode 49 or the target and an anode 52. The arc discharge serves to discharge carbon ions from the target. A material flow of the carbon ions or a carbonic ion beam 55 is guided to the support plate 48 with the assistance of a cathode coil 53 and a raster coil 54. Non-ionized particles and masses of the carbon are trapped at a filter coil 56. The carbon ions are thus allowed to reach the wafer bars 43 on the support plate 48 at a remarkably higher density. Carbonic structure including $sp^3$ carbon bonds at a rate equal to or higher than 80%, namely, tetrahedral amorphous carbon is generated on the sections 44 of the wafer bars 43.

$CF_4$ gas is introduced in the chamber 47 of the FCA apparatus 46. An atmosphere of the $CF_4$ gas is established in the chamber 47 when tetrahedral amorphous carbon is formed. Accordingly, fluorine atoms are scattered into the tetrahedral amorphous carbon. Alternatively, an ion beam 57 of $CF_4$ gas may be utilized to scatter fluorine atoms into the tetrahedral amorphous carbon. An ion gun 58 may be connected to the chamber 47 to realize the ion beam 57. If the ion beam 57 is irradiated in the direction perpendicular to the carbonic ion beam 55, the homogeneity of the fluorine atoms can be established within the hard carbon film 29. In the case where the output power of the ion gun 58 is set larger, the ion beam 57 of the $CF_4$ gas is preferably oriented in parallel with the sections 44 of the wafer bar 43, as shown in FIG. 7. The density of the fluorine can be controlled based on the flow rate of the $CF_4$ gas, the level of the electric power applied to the ion gun 58, and the like.

The present inventor has observed the quality of the hard carbon film 29. In this observation, the inventor have made some kinds of the hard carbon film 29 over silicon wafers. The thickness of the hard carbon films 29 was set at 50.0 nm. The content of the fluorine was set differently for the individual hard carbon films 29. X-ray photoelectron spectroscopy was utilized to measure the content of the fluorine in the hard carbon films 29.

Figure 8:
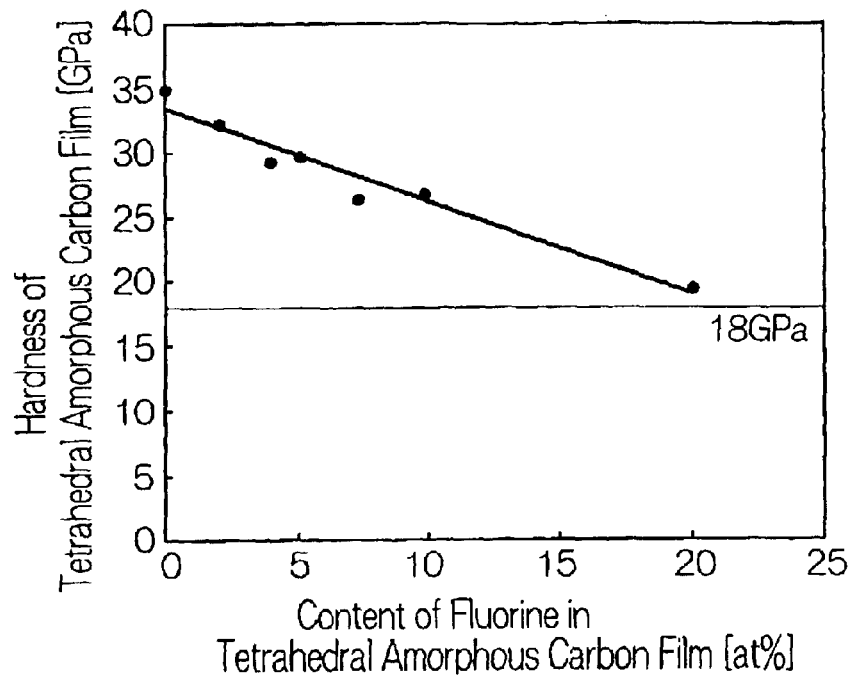
FIG. 8 is a graph illustrating the relationship between the content of the fluorine and the hardness for the hard carbon film.
Figure 9:
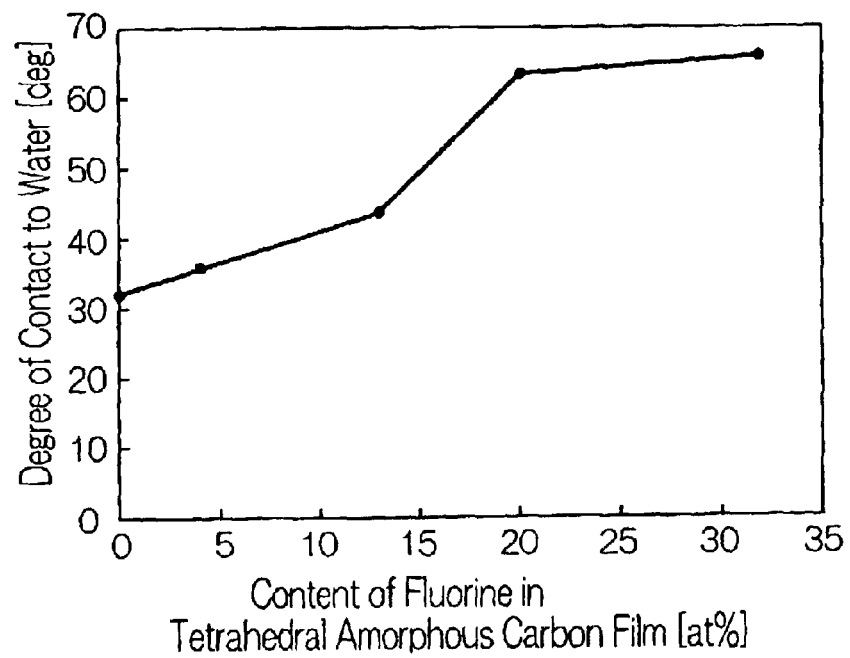
FIG. 9 is graph illustrating the relationship between the content of the fluorine and the angle of contact to water for the hard carbon film.

The present inventor has measured the hardness and the angle of contact to water for the individual hard carbon films 29. Nano indenter II of Nano Instruments was used to measure the hardness of the hard carbon films 29. As is apparent from FIG. 8, approximately the hardness of 20 GPa can be obtained even when the content of the fluorine atoms is set at 20 at % within the hard carbon film 29. The inventor has confirmed that the maximum hardness of a carbon film made by electronic cyclotron resonance chemical vapor deposition or ion beam deposition reached approximately 18 GPa. The content of the fluorine atoms below 20 at % within the hard carbon film 29 still provides a sufficient hardness for the hard carbon film 29. In addition, even if the content of the fluorine atoms are set below 20 at % within the hard carbon film 29, a sufficient repellent performance to water can be obtained on the surface of the hard carbon film 29, as is apparent from FIG. 9.

What is claimed is:

1. A method of making a tetrahedral amorphous carbon film comprising: subjecting an object to irradiation of a carbonic ion beam, while a surface of the object is exposed to fluorine atoms, so that carbon atoms are deposited over the surface of the object.

2. The method according to claim 1, wherein the object is located within an atmosphere of a compound gas including fluorine when the object is exposed to the fluorine atoms.

3. The method according to claim 1, wherein the carbonic ion beam is generated based on a filtered cathodic arc.

4. A method according of making a tetrahedral amorphous carbon film, comprising: depositing carbon atoms over a surface of an object, while the surface of the object is exposed to fluorine atoms, wherein the object is subjected to irradiation of a fluoric ion beam when the object is exposed to the fluorine atoms.

5. The method according to claim 4, wherein the object is subjected to irradiation of a carbonic ion beam when the carbon atoms are deposited over the surface of the object.

6. The method according to claim 5, wherein the carbonic ion beam is generated based on a filtered cathodic arc.

* * * * *

UNITED STATES PATENT AND TRADEMARK OFFICE
CERTIFICATE OF CORRECTION

PATENT NO. : 6,913,795 B2 Page 1 of 1
APPLICATION NO. : 10/281648
DATED : July 5, 2005
INVENTOR(S) : Hyodo It is certified that error appears in the above-identified patent and that said Letters Patent is hereby corrected as shown below:

Col. 6, line 51, delete "according" therefor

Signed and Sealed this

Twelfth Day of September, 2006

JON W. DUDAS
*Director of the United States Patent and Trademark Office*